US012796159B2

(12) United States Patent
Hsu

(10) Patent No.: US 12,796,159 B2
(45) Date of Patent: Nov. 10, 2026

(54) LENS PACKAGING MODULE WITH A PASSIVE COMPONENT AND A PHOTOSENSITIVE CHIP, PREPARATION METHOD OF THE LENS PACKAGING MODULE, AND ELECTRONIC DEVICE HAVING THE LENS PACKAGING MODULE

(71) Applicant: Rayprus Technology (Foshan) Co., Ltd., Foshan (CN)

(72) Inventor: Hsin-Yen Hsu, New Taipei (TW)

(73) Assignee: Rayprus Technology (Foshan) Co., Ltd., Foshan (CN)

( * ) Notice: Subject to any disclaimer, the term of this patent is extended or adjusted under 35 U.S.C. 154(b) by 556 days.

(21) Appl. No.: 18/242,145

(22) Filed: Sep. 5, 2023

(65) Prior Publication Data

US 2024/0266448 A1 Aug. 8, 2024

(30) Foreign Application Priority Data

Feb. 6, 2023 (CN) ......................... 202310088682.5

(51) Int. Cl.
*H10F 77/40* (2025.01)
*H10F 77/50* (2025.01)

(52) U.S. Cl.
CPC ........... *H10F 77/413* (2025.01); *H10F 77/50* (2025.01)

(58) Field of Classification Search
CPC ....... H10F 77/413; H10F 77/50; G02B 7/025; G02B 13/00; G03B 17/00; G03B 17/12
See application file for complete search history.

(56) References Cited

U.S. PATENT DOCUMENTS

| | | | | |
|---|---|---|---|---|
| 2011/0194023 | A1 | 8/2011 | Tam et al. | |
| 2020/0007726 | A1* | 1/2020 | Wang ..................... | G03B 17/02 |
| 2020/0162648 | A1* | 5/2020 | Wang ..................... | G02B 7/021 |
| 2022/0303436 | A1* | 9/2022 | Luan ..................... | H04N 23/57 |

FOREIGN PATENT DOCUMENTS

| | | |
|---|---|---|
| CN | 108401093 | 8/2018 |
| CN | 110832835 | 2/2020 |
| TW | 201921081 | 6/2019 |
| TW | 202141098 | 11/2021 |

* cited by examiner

*Primary Examiner* — Eliseo Ramos Feliciano
*Assistant Examiner* — Sophia W Kao
(74) *Attorney, Agent, or Firm* — ScienBiziP, P.C.

(57) ABSTRACT

A lens packaging module with miniaturized size, and an electronic device carrying it, includes a circuit board, a passive component, an encapsulation portion, a photosensitive chip, and a lens assembly. The encapsulation portion is provided on the circuit board to cover the passive component, and the lens assembly is formed on the encapsulation portion. Thus, the area occupied by the passive component on the circuit board overlaps at least partially with the area occupied by the lens assembly, so that the overall size of the lens packaging module of the present application can be reduced. A preparation method of the lens packaging module is also provided.

17 Claims, 7 Drawing Sheets

LENS PACKAGING MODULE WITH A PASSIVE COMPONENT AND A PHOTOSENSITIVE CHIP, PREPARATION METHOD OF THE LENS PACKAGING MODULE, AND ELECTRONIC DEVICE HAVING THE LENS PACKAGING MODULE

FIELD

The subject matter herein generally relates to electronics, and more particularly, to a miniaturized lens packaging module, a preparation method of the lens packaging module, and an electronic device having the lens packaging module.

BACKGROUND

A lens packaging module may include a circuit board, a passive component, and a photosensitive chip. The passive component and the photosensitive chip may be mounted on an upper surface and a lower surface of the circuit board by a flip chip (FC) technology, respectively. Except for an area of the upper surface of the circuit board corresponding to a photosensitive area of the photosensitive chip, the rest area of the upper surface can be used to place the passive component, as well as an optical filter and a lens assembly. However, when the size of the photosensitive chip becomes larger, the circuit board may also need to be larger for mounting the passive component and the lens assembly. Thus, the overall size of the lens packaging module is increased.

Therefore, there is room for improvement in the art.

BRIEF DESCRIPTION OF THE DRAWINGS

Implementations of the present disclosure will now be described, by way of embodiments only, with reference to the attached figures.

DETAILED DESCRIPTION

Figure 1:
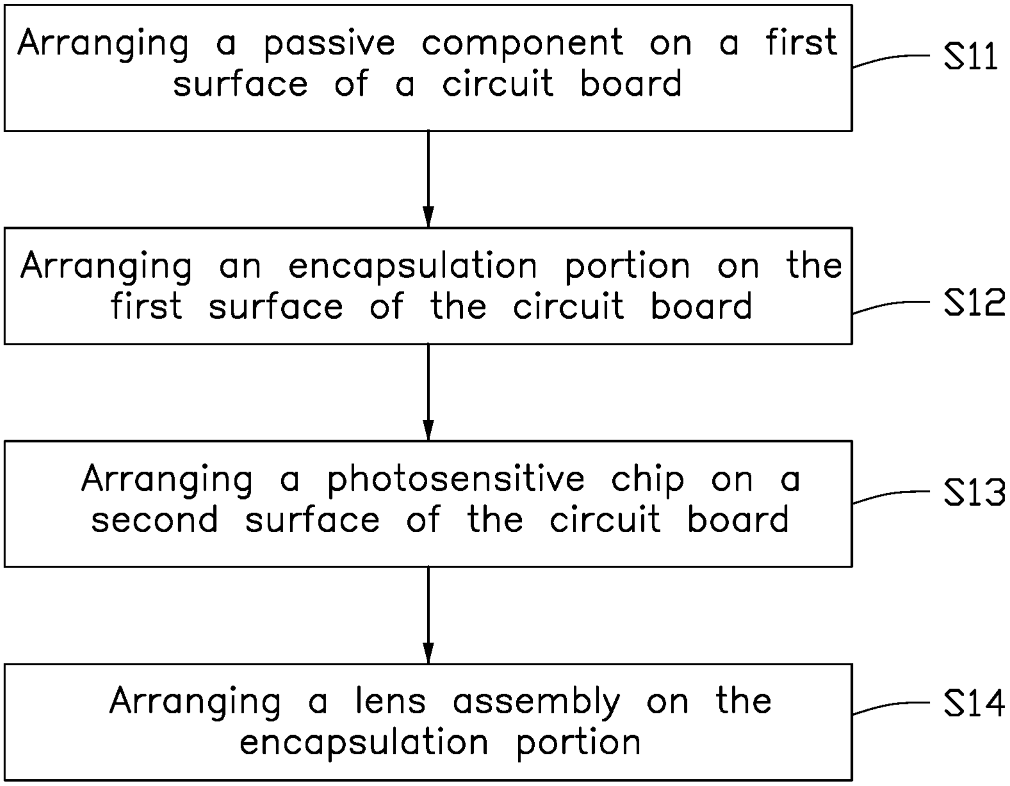
FIG. 1 is a flowchart of a preparation method of a lens packaging module according to an embodiment of the present disclosure.

Unless otherwise defined, all technical and scientific terms used herein have the same meaning as commonly understood by persons skill in the art. The terms used herein are only for the purpose of describing specific embodiments, and not intended to limit the embodiments of the present application.

In this application, descriptions such as "first", "second" etc. are only used for description purposes and should not be understood as indicating or implying their relative importance or implying the number of indicated technical features. Thus, a feature defined as "first" and "second" may expressly or implicitly include at least one of that feature. In the description of the present application, "plurality" means more than one unless expressly and specifically defined otherwise.

It should be noted that all directional indications (such as up, down, left, right, front, back, etc.) in the embodiments of the present application are only used to explain the relative positional relationship or movement between various components under a certain posture (as shown in the drawings). If the specific posture changes, the directional indication also changes accordingly.

Some embodiments of the present application will be described in detail below with reference to the drawings. The following embodiments and features of the embodiments may be combined with each other in the absence of conflict.

Referring to FIG. 1, a preparation method of a lens packaging module 100 is disclosed in an embodiment of the present disclosure. The method is provided by way of example, as there are a variety of ways to carry out the method. The method can begin at step S11.

Figure 2:
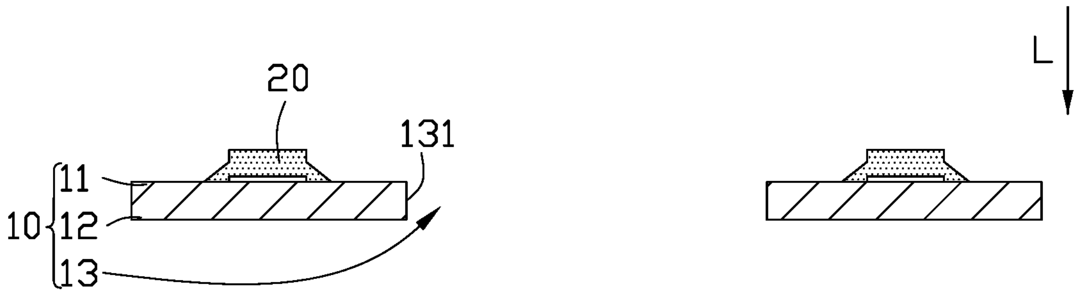
FIG. 2 is a cross-sectional view of a circuit board according to an embodiment of the present disclosure.

Step S11: referring to FIG. 2, at least one passive component 20 is formed on a surface of a circuit board 10.

Along a thickness direction L of the circuit board 10, the circuit board 10 includes a first surface 11 and a second surface 12 opposite to the first surface 11. The circuit board 10 defines a through hole 13. The through hole 13 passes through the first surface 11 and the second surface 12 along the thickness direction L, and the through hole 13 has an inner wall 131. The passive component 20 is disposed on the first surface 11. Each passive component 20 may be, but not limited to, a resistor, a capacitor, an inductor and so on.

In this embodiment, a number of passive components 20 are disposed around the through hole 13 by a surface mount technology (SMT), and the passive components 20 are electrically connected to the circuit board 10. Considering the optical identification accuracy and mechanical accuracy when defining the through hole 13, each of the passive components 20 is arranged at a certain distance from the through hole 13.

Figure 3:
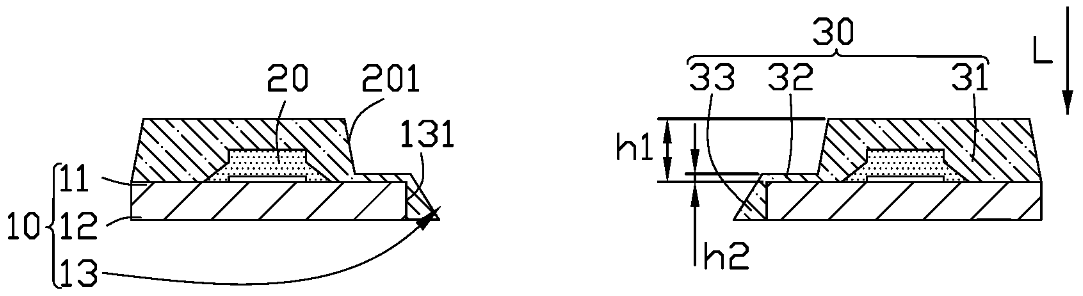
FIG. 3 is a cross-sectional view showing an encapsulation portion formed on a first surface of the circuit board in FIG. 2.

Step S12: referring to FIG. 3, an encapsulation portion 30 covering the passive components 20 is formed on the first surface 11 of the circuit board 10.

In this embodiment, the encapsulation portion 30 includes a main body portion 31, a first extension portion 32, and a second extension portion 33 which are sequentially connected to each other. The main body portion 31 covers the passive components 20. The first extension portion 32 extends from the main body portion 31 towards the through hole 13, and the first extension portion 32 is disposed on the first surface 11. The second extension portion 33 extends from the edge of the first extension portion 32 away from the main body portion 31 towards the inner wall 131 of the through hole 13. The second extension portion is disposed on the inner wall 131. Along the thickness direction L, the height h1 of the main body portion 31 is greater than the height h2 of the first extension portion 32, thereby forming a stepped portion 301.

In some embodiments, the encapsulation portion 30 is formed on the circuit board 10 by injection molding. In other embodiments, a molding process may be used to form the encapsulation portion 30. The material of the encapsulation portion 30 used in the injection molding may be nylon, liquid crystal polymer (LCP), polypropylene (PP), etc. The material of the encapsulation portion 30 used in the molding process may be epoxy resin.

By covering the passive component 20, the first surface 11 of the circuit board 10, and the inner wall 131 of the through hole 13 with the encapsulation portion 30, contamination of particles during packaging can be reduced, and light interference can also be reduced to improve imaging quality.

In some embodiments, a surface treatment may further be performed on the encapsulation portion 30. The surface treatment is used to remove wax and dust on the encapsulation portion 30 and the circuit board 10, so as to reduce contamination and damage to a photosensitive chip 40 and a filter 60 (referring to FIG. 6) during the subsequent packaging process. In this embodiment, the surface treatment is plasma cleaning.

Figure 4:
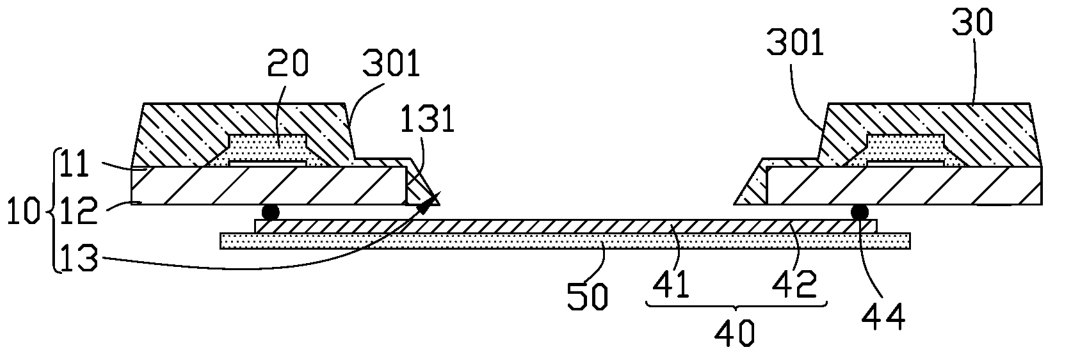
FIG. 4 is a cross-sectional view showing a photosensitive chip formed on a second surface of the circuit board in FIG. 3.

Step S13: referring to FIG. 4, a photosensitive chip 40 is formed on the second surface 12, and the photosensitive chip 40 is electrically connected to the circuit board 10.

The photosensitive chip 40 has a photosensitive area 41 and a non-photosensitive area 42 surrounding the photosensitive area 41. The non-photosensitive area 42 is provided with a plurality of first pads (not shown), which are electrically connected to the circuit board 10 through a solder paste 44. The photosensitive area 41 corresponds to the through hole 13.

The second surface 12 is provided with a plurality of second pads (not shown). The first pads of the photosensitive chip 40 correspond to the second pads one by one, and the first pads and the second pads are conducted to each other through the solder paste 44. The through hole 13 is configured for allowing light from the ambient environment to pass through. The position of the through hole 13 matches the position of the photosensitive area 41, and the size of the through hole 13 matches the size of the photosensitive area 41.

In this embodiment, the photosensitive chip 40 is attached to the second surface 12 by a flip chip process, and the solder paste 44 includes gold balls.

In some embodiments, a protective plate 50 may further be formed on a surface of the photosensitive chip 40 away from the circuit board 10.

In this embodiment, the protective plate 50 is a stainless-steel plate, and the area of the protective plate 50 is larger than that of the photosensitive chip 40. The protective plate 50 is used to protect the photosensitive chip 40 and improve a flatness of the lens packaging module 100.

Figure 5:
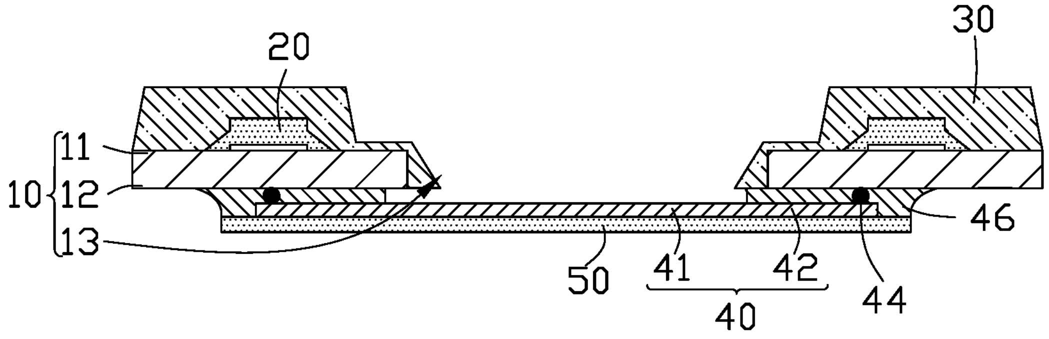
FIG. 5 is a cross-sectional view showing an underfill formed on the second surface of the circuit board in FIG. 4.

Referring to FIG. 5, Step S14 further includes: an insulating glue 46 is formed on the second surface 12 of the circuit board 10 to cover the non-photosensitive area 42, the solder paste 44, and a portion of the protective plate 50.

In this embodiment, the edge of the photosensitive chip 40 is filled with a thermosetting glue, and the thermosetting glue is heated and solidified to form the insulating glue 46. The material of the thermosetting glue can be epoxy resin. The insulating glue 46 can effectively improve the strength of the connection between the circuit board 10 and the photosensitive chip 40, thereby increasing the service life of the photosensitive chip 40.

Figure 6:
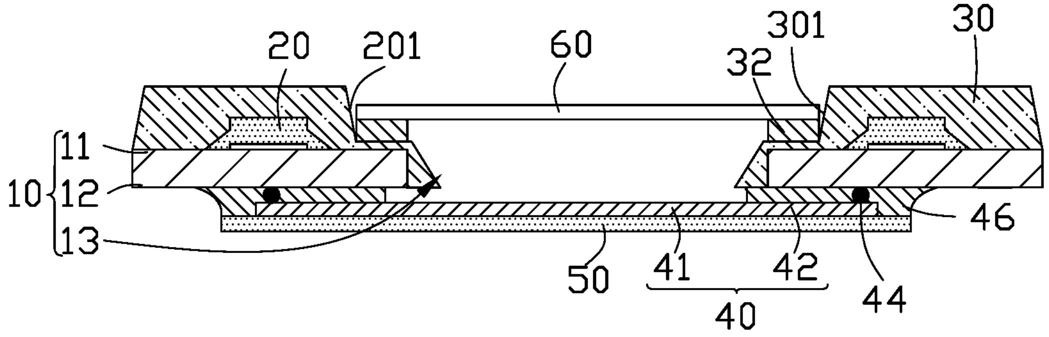
FIG. 6 is a cross-sectional view showing a filter formed on a first extension portion of the encapsulation portion in FIG. 5.

Referring to FIG. 6, after forming the insulating glue 46, a filter 60 is formed on the encapsulation portion 30. The filter 60 faces the through hole 13.

In this embodiment, the filter 60 is disposed on the first extension portion 32, that is, the filter 60 is disposed on the stepped portion 301. The filter 60 corresponds to the photosensitive area 41.

Figure 7:
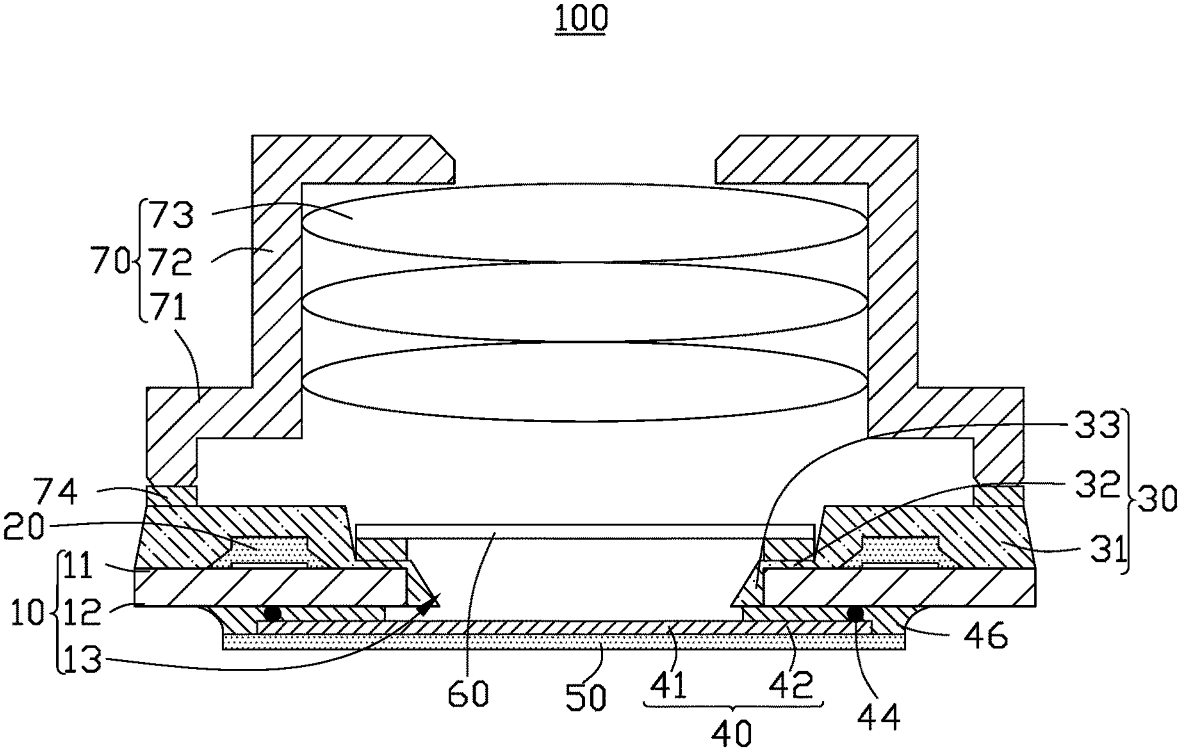
FIG. 7 is a diagrammatic view of a lens packaging module according to an embodiment of the present disclosure.

Step S14: referring to FIG. 7, a lens assembly 70 is formed on a surface of the encapsulation portion 30 away from the circuit board 10 to obtain the lens packaging module 100. Along the thickness direction L, the orthographic projection of the passive component 20 overlaps at least partially with that of the lens assembly 70. That is, the area occupied by the passive component 20 on the circuit board 10 overlaps at least partially with the area occupied by the lens assembly 70. Thus, the overall size of the lens packaging module 100 of the present application can be reduced.

The lens assembly 70 may include a lens holder 71, a lens barrel 72 connected to the lens holder 71, and at least one lens 73 arranged in the lens barrel 72. The optical axis of the lens 73 is coaxial with the central axis of the filter 60. The central axes of the filter 60, the through hole 13, and the photosensitive chip 40 are coaxial with each other. The cross-section of the lens holder 71 is substantially L-shaped, and the cross-section of the lens barrel 72 is substantially L-shaped.

In this embodiment, the lens holder 71 is square, and is fixed on the surface of the main body portion 31 away from the circuit board 10 by a fixing glue 74. Along the thickness direction L, the orthographic projection of the passive component 20 overlaps at least partially with that of the lens holder 71 or the lens barrel 72.

Referring to FIG. 7, the present application further provides a lens packaging module 100 prepared by the above-mentioned method. The lens packaging module 100 includes a circuit board 10, a passive component 20, an encapsulation portion 30, a photosensitive chip 40, a protective plate 50, a filter 60, and a lens assembly 70. The circuit board 10 includes a first surface 11 and a second surface 12 opposite to the first surface 11. The passive component 20 is disposed on the first surface 11, and the photosensitive chip 40 is disposed on the second surface 13. The encapsulation portion 30 covers the passive component 20, and the protective plate 50 is disposed on a surface of the photosensitive chip 40 away from the circuit board 10. The filter 60 and the lens assembly 70 are disposed on a surface of the encapsulation portion 30 away from the circuit board 10.

The circuit board 10 defines a through hole 13. The through hole 13 passes through the first surface 11 and the second surface 12 along the thickness direction L, and the through hole 13 has an inner wall 131. Each passive component 20 may be, but not limited to, a resistor, a capacitor, an inductor and so on.

The encapsulation portion 30 includes a main body portion 31, a first extension portion 32, and a second extension portion 33 which are sequentially connected to each other. The main body portion 31 covers the passive components 20. The first extension portion 32 extends from the main body portion 31 towards the through hole 13, and the first extension portion 32 is disposed on the first surface 11. The second extension portion 33 extends the edge of the first extension portion 32 away from the main body portion 31 towards the inner wall 131 of the through hole 13. The second extension portion is disposed on the inner wall 131. The height h1 of the main body portion 31 is greater than the height h2 of the first extension portion 32, thereby forming a stepped portion 301.

The photosensitive chip 40 has a photosensitive area 41 and a non-photosensitive area 42 surrounding the photosensitive area 41, and the photosensitive area 41 corresponds to the through hole 13. The non-photosensitive area 42 is electrically connected to the circuit board 10 through a solder paste 44. The filter 60 is disposed on a surface of the first extension portion 32, that is, the filter 60 is disposed on the stepped portion 301. The filter 60 corresponds to the photosensitive area 41.

In some embodiments, the second surface 12 is further provided with an insulating glue 46. The insulating glue 46 covers the non-photosensitive area 42, the solder paste 44, and a portion of the protective plate 50.

The lens assembly 70 includes a lens holder 71, a lens barrel 72 connected to the lens holder 71, and at least one lens 73 arranged in the lens barrel 72. The optical axis of the lens 73 is coaxial with the central axis of the filter 60. The central axes of the filter 60, the through hole 13, and the photosensitive chip 40 are coaxial with each other. In this embodiment, the square lens holder 71 is fixed on the main body portion 31 by a fixing glue 74.

Figure 8:
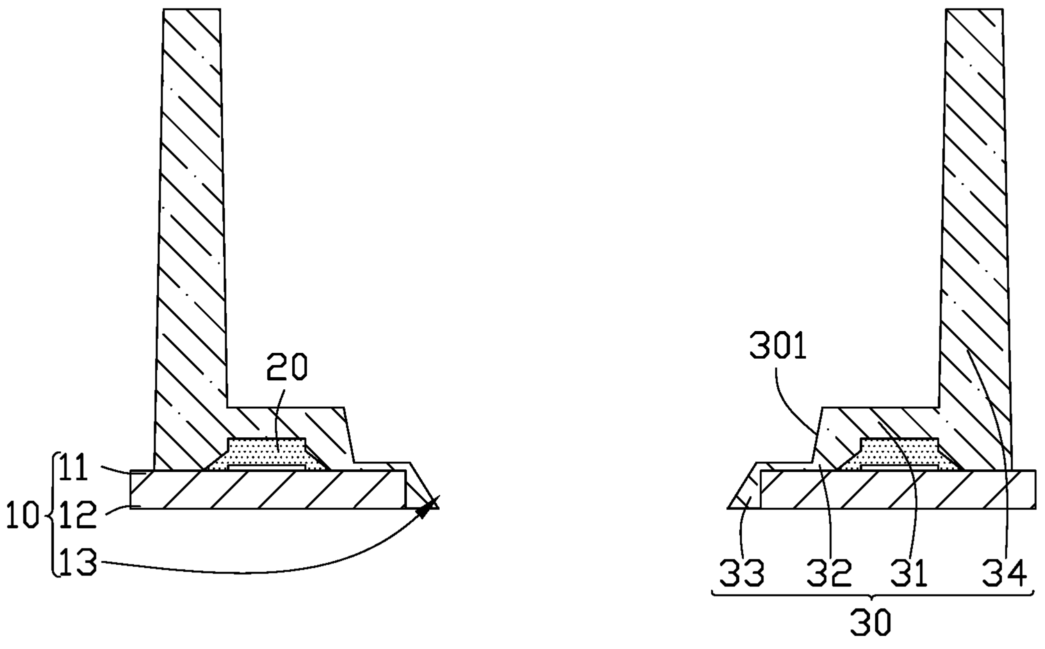
FIG. 8 is a cross-sectional view showing another encapsulation portion formed on the first surface of the circuit board in FIG. 2.
Figure 9:
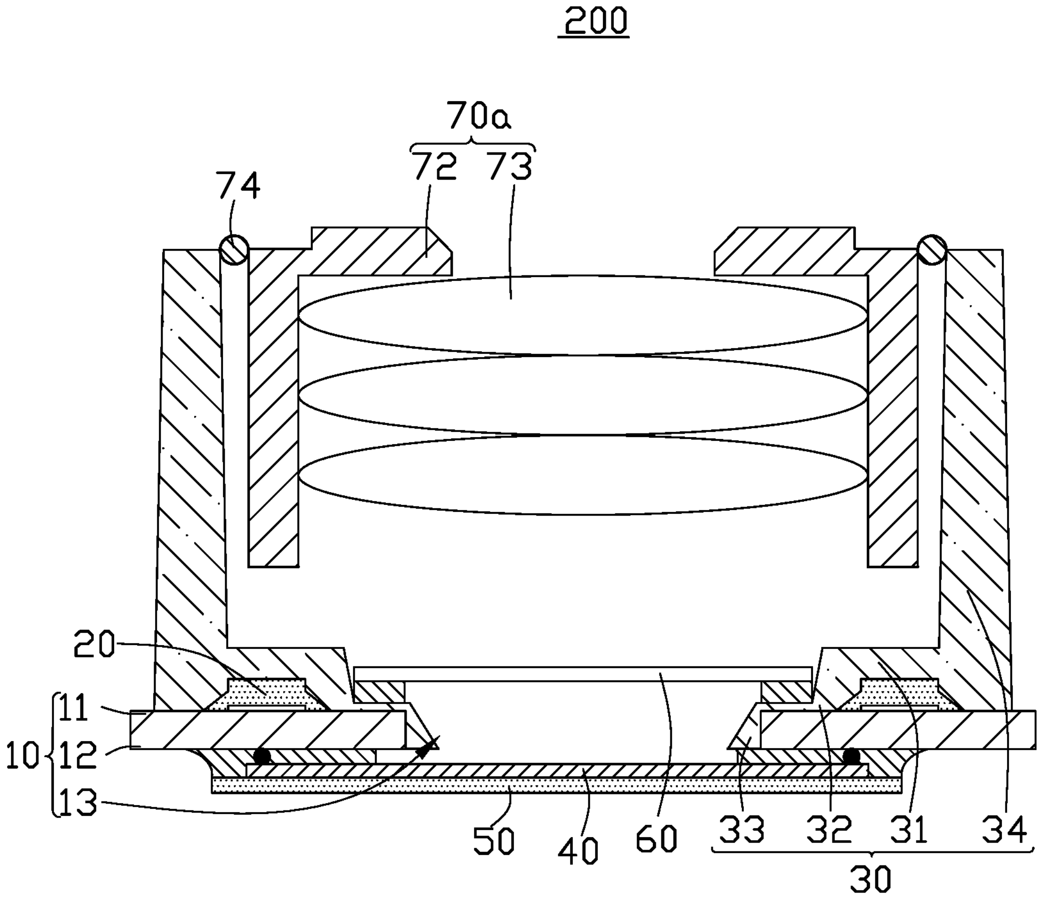
FIG. 9 is a diagrammatic view of a lens packaging module according to another embodiment of the present disclosure.

Referring to FIGS. 8 and 9, a preparation method of a lens packaging module 200 is also disclosed in another embodiment of the present disclosure. The method is substantially the same as the preparation method of the lens packaging module 100, and the differences are in steps S12 and S14.

In step S12, referring to FIG. 8, the encapsulation portion 30 is further provided with a cylindrical portion 34 connected to the main body portion 31. The cylindrical portion 34

The cylindrical portion 34 is cylindrical and can function as the lens holder 71 of the lens packaging module 100. The cylindrical portion 34 is connected to a side of the main body portion 31 away from the first extension portion 32. The cylindrical portion 34 extends from the surface of the main body portion 31 away from the passive component 20 towards the direction away from the passive component.

In step S14, the lens assembly 70*a* is provided with a lens barrel 72 and at least one lens 73 accommodated in the lens barrel 72. When mounting the lens assembly 70*a*, the lens assembly 70*a* is connected to the end of the cylindrical portion 34 away from the main body portion 31, and the lens assembly 70*a* is accommodated in the cylindrical portion 34. In at least one embodiment, the lens assembly 70*a* is connected to the end of the cylindrical portion 34 away from the main body portion 31 through a fixing glue 74. The lens 73 is a screwless lens.

Referring to FIG. 9, the present application further provides a lens packaging module 200 prepared by the above-mentioned method. The structure of the lens packaging module 200 is substantially the same as that of the lens packaging module 100, but the differences are that the encapsulation portion 30 further includes a cylindrical portion 34 connected to the main body portion 31, and an end of the cylindrical portion 34 is connected to a lens assembly 70*a*. The lens assembly 70*a* is accommodated in the cylindrical portion 34, and includes a lens barrel 72 and at least one lens 73.

In this embodiment, the cylindrical portion 34 is connected to the side of the main body portion 31 away from the first extension portion 32. The lens assembly 70*a* is connected to the end of the cylindrical portion 34 away from the main body portion 31 through a fixing glue 74. The lens 73 is accommodated in the lens barrel 72, and the lens 73 is a screwless lens. The cylindrical portion 34 can function as the lens holder 71, so the lens assembly 70*a* can omit the lens holder 71. Along the thickness direction L, the orthographic projection of the passive component 20 overlaps at least partially with that of lens barrel 72.

Figure 10:
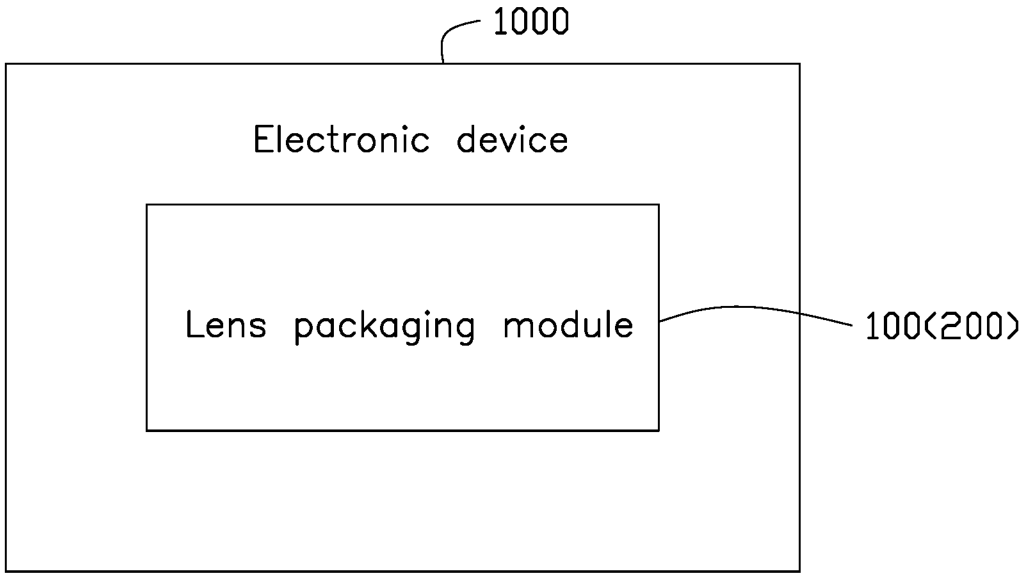
FIG. 10 is a diagrammatic view of an electronic device according to an embodiment of the present disclosure.

Referring to FIG. 10, the present application further provides an electronic device 1000, which includes the lens packaging module 100 (200) as described above. The electronic device 1000 may be, but not limited to, mobile phones or the like.

In the present application, the encapsulation portion 30 is provided on the surface of the circuit board 10 to cover the passive component 20, and the lens assembly 70 is formed on the encapsulation portion 30, so that the area occupied by the passive component 20 on the circuit board 10 overlaps at least partially with the area occupied by the lens assembly 70. Thus, the overall size of the lens packaging module 100 (200) of the present application can be reduced.

In addition, by setting the first extension portion 32 and the second extension portion 33 to cover the first surface 11 of the circuit board 10 and the inner wall 131 of the through hole 13, contamination of particles during packaging can be reduced, and light interference can also be reduced to improve imaging quality.

The above descriptions are some specific embodiments of the present application, but the actual application process cannot be limited only to these embodiments. For those of ordinary skill in the art, other modifications and changes made according to the technical concept of the present application should all belong to the protection scope of the present application.

What is claimed is:

1. A lens packaging module comprising:

a circuit board comprising a first surface and a second surface opposite to the first surface, the circuit board further defining a through hole extending through the first surface and the second surface;

a passive component;

a photosensitive chip, wherein the passive component and the photosensitive chip are arranged on the first surface and the second surface, respectively, and the photosensitive chip corresponds in position to the through hole;

an encapsulation portion comprising a main body portion arranged on the first surface, wherein the main body portion covers the passive component; and a lens assembly formed on the encapsulation portion and corresponding in position to the through hole, wherein, along a thickness direction, an orthographic projection of the passive component overlaps at least partially with an orthographic projection of the lens assembly; and wherein the photosensitive chip comprises a photosensitive area and a non-photosensitive area surrounding the photosensitive area, the non-photosensitive area is welded on the second surface, and the photosensitive area corresponds in position to the through hole.

2. The lens packaging module of claim 1, wherein the encapsulation portion further comprises a first extension portion and a second extension portion, the first extension portion is arranged on the first surface, one end of the first extension portion is connected to the main body portion and another end of the first extension portion is connected to the second extension portion, and the second extension portion covers an inner wall of the through hole.

3. The lens packaging module of claim 2, wherein the encapsulation portion further comprises a cylindrical portion, and the lens assembly is accommodated in the cylindrical portion.

4. The lens packaging module of claim 3, further comprising a fixing glue, wherein the lens assembly comprises a lens barrel and a lens accommodated in the lens barrel, and the lens barrel is connected to the cylindrical portion through the fixing glue.

5. The lens packaging module of claim 2, further comprising a filter, wherein a height of the main body portion is greater than a height of the first extension portion, thereby forming a stepped portion between the main body portion and the first extension portion, and the filter is arranged on the stepped portion and corresponds in position to the through hole.

6. The lens packaging module of claim 1, further comprising a protective plate, wherein the protective plate is arranged on a surface of the photosensitive chip away from the circuit board.

7. The lens packaging module of claim 6, further comprising an insulating glue, wherein the insulating glue is arranged between the circuit board and the photosensitive chip, and the insulating glue covers at least a portion of the non-photosensitive area and a portion of the protective plate.

8. A preparation method of a lens packaging module, the preparation method comprising:

arranging a passive component on a first surface of a circuit board, wherein the circuit board defines a through hole;

arranging an encapsulation portion on the first surface of the circuit board, wherein the encapsulation portion comprises a main body portion covering the passive component;

arranging a photosensitive chip on a second surface of the circuit board, wherein the second surface is opposite to the first surface;

arranging a lens assembly on the encapsulation portion, wherein the lens assembly and the photosensitive chip are located at opposite sides of the through hole, along a thickness direction, an orthographic projection of the passive component overlaps at least partially with an orthographic projection of the lens assembly;

wherein the photosensitive chip comprises a photosensitive area and a non-photosensitive area surrounding the photosensitive area, and arranging the photosensitive chip on the second surface further comprises welding the non-photosensitive area to the second surface, wherein the photosensitive area corresponds in position to the through hole.

9. The preparation method of claim 8, wherein the encapsulation portion is further provided with a first extension portion and a second extension portion, the first extension portion is arranged on the first surface, one end of the first extension portion is connected to the main body portion and another end of the first extension portion is connected to the second extension portion, and the second extension portion covers an inner wall of the through hole, a height of the main body portion is greater than a height of the first extension portion, so that the main body portion and the first extension portion form a stepped portion.

10. The preparation method of claim 9, wherein the lens assembly is provided with a lens barrel and a lens accommodated in the lens barrel, the encapsulation portion is further provided with a cylindrical portion connected to the main body portion, and arranging the lens assembly on the encapsulation portion further comprises:

bonding the lens barrel to the cylindrical portion by a fixing glue.

11. The preparation method of claim 9, wherein after arranging the photosensitive chip on the second surface, the preparation method further comprises:

arranging a filter on the stepped portion, wherein the filter corresponds in position to the photosensitive chip.

12. The preparation method of claim 8, wherein after arranging the photosensitive chip on the second surface, the preparation method further comprises:

forming a protective plate on a surface of the photosensitive chip away from the circuit board.

13. The preparation method of claim 12, wherein after arranging the photosensitive chip on the second surface, the preparation method further comprises:

arranging an insulating glue between the circuit board and the photosensitive chip, wherein the insulating glue covers at least a portion of the non-photosensitive area and a portion of the protective plate.

14. An electronic device comprising:

a lens packaging module comprising:

a circuit board comprising a first surface and a second surface opposite to the first surface, the circuit board further defining a through hole extending through the first surface and the second surface;

a passive component;

a photosensitive chip, wherein the passive component and the photosensitive chip are arranged on the first surface and the second surface, respectively, and the photosensitive chip corresponds in position to the through hole;

an encapsulation portion comprising a main body portion arranged on the first surface, wherein the main body portion covers the passive component; and a lens assembly formed on the encapsulation portion and corresponding in position to the through hole, wherein, along a thickness direction, an orthographic projection of the passive component overlaps at least partially with an orthographic projection of the lens assembly;

wherein the photosensitive chip comprises a photosensitive area and a non-photosensitive area surrounding the photosensitive area, the non-photosensitive area is welded on the second surface, and the photosensitive area corresponds in position to the through hole.

15. The electronic device of claim 14, wherein the encapsulation portion further comprises a first extension portion and a second extension portion, the first extension portion is arranged on the first surface, one end of the first extension portion is connected to the main body portion and another end of the first extension portion is connected to the second extension portion, and the second extension portion covers an inner wall of the through hole.

16. The electronic device of claim 15, further comprising a filter, wherein a height of the main body portion is greater than a height of the first extension portion, thereby forming a stepped portion between the main body portion and the first extension portion, and the filter is arranged on the stepped portion and corresponds in position to the through hole.

17. The electronic device of claim 14, further comprising a protective plate and an insulating glue, wherein the protective plate is arranged on a surface of the photosensitive chip away from the circuit board, the insulating glue is arranged between the circuit board and the photosensitive chip, and the insulating glue covers at least a portion of the non-photosensitive area and a portion of the protective plate.

* * * * *